Aug. 19, 1969 P. B. SPRANGER 3,462,553

SOLID-STATE AMPLIFIER, AND CONTROL PANEL
ASSEMBLY INCORPORATED THEREIN
Filed June 2, 1966

INVENTOR.
PAUL B. SPRANGER
BY Jancewitz & Carr
ATTORNEYS.

United States Patent Office 3,462,553

Patented Aug. 19, 1969

3,462,553
SOLID-STATE AMPLIFIER, AND CONTROL PANEL ASSEMBLY INCORPORATED THEREIN

Paul B. Spranger, Fullerton, Calif., assignor to Columbia Broadcasting System, Inc., New York, N.Y., a corporation of New York Filed June 2, 1966, Ser. No. 554,764
Int. Cl. H04v *1/02;* H03f *3/04*
U.S. Cl. 179—1 5 Claims

ABSTRACT OF THE DISCLOSURE

A solid-state amplifier and loudspeaker combination, in which the control panel for the amplifier cooperates in defining a chamber in which are disposed various components of the amplifier. A heat sink is mounted in such chamber and in heat-transfer relationship with the power transistor of the amplifier. Upper and lower port means are provided in the control panel and are disposed for convective flow of cooling air past the heat sink.

This invention relates to a solid-state amplifier and to the control panel assembly therefor. More specifically, the invention relates to a control panel assembly incorporating means to effect convective air-cooling of the power transistors of a portable solid-state amplifier.

In solid-state amplifiers, particularly portable, high-power amplifiers such as are frequently employed in conjunction with electrical musical instruments, public address systems, etc., the cooling of the power transistors is a major problem. It is very desirable and important that the power transistors be maintained relatively cool, yet it is impractical to employ forced-air cooling, water cooling, etc. In particular, forced-air cooling is undesirable not only because of the increased expense and power required to drive a fan, and the noise incident thereto, but also because the motor which drives the fan may create electrical disturbances in the amplifier or surrounding space. Water cooling is distinctly impractical because of the unavailability of any practical water-circulating means in the vast majority of places where the amplifier is utilized.

Prior-art attempts to achieve convective air-cooling of the power transistors in a solid-state amplifier of the indicated type have, heretofore, not produced practical or satisfactory results. A major reason for such lack of success is that the heat sink for the power transistors has previously been located in the back region of the amplifier, and not, insofar as the present applicant is aware, in the control panel thereof. When such heat sink is located in the back of the amplifier, it frequently occurs that the musician or other person utilizing the amplifier places the same adjacent a wall, etc., and thus blocks or severely reduces the flow of air. Accordingly, overheating of the power transistors, and consequent failure thereof, may result.

In accordance with the present invention, the heat sink for the power transistors is mounted in the control panel itself, which control panel is normally maintained by the musician in a readily accessible (and thus fully exposed) position where flow of air is not impeded. In addition, the present invention contemplates causing at least the lower portion of the control panel to be in an overhanging relationship relative to the lower regions of the apparatus, and relative to the supporting surface therefor, and providing air-opening means in the overhanging portion whereby air will circulate upwardly through the heat sink in an efficient manner and one which minimizes the possibility of recirculation of warm air. Because of the overhanging nature of at least the lower portion of the control panel, it is assured that flow of air will not be blocked even in the unlikely event that the musician places the control panel adjacent a wall or other object.

In view of the above, it is an object of the present invention to provide a solid-state amplifier incorporating highly simple, effective, quiet, inexpensive and functional means for cooling the power transistors, regardless of the location where the musician or other operator may place the apparatus during use thereof.

Another object is to provide a solid-state amplifier in which the heat sink for the power transistors is incorporated in the control panel as indicated above, and in which at least the lower region of the control panel is caused to overhang the underlying or supporting regions for or of the apparatus, thus making it difficult to block or diminish the efficient flow of cooling air through the heat sink.

These and other objects will become apparent from the following detailed description taken in connection with the accompanying drawing in which.

Figures 1, 2, 3, 4:
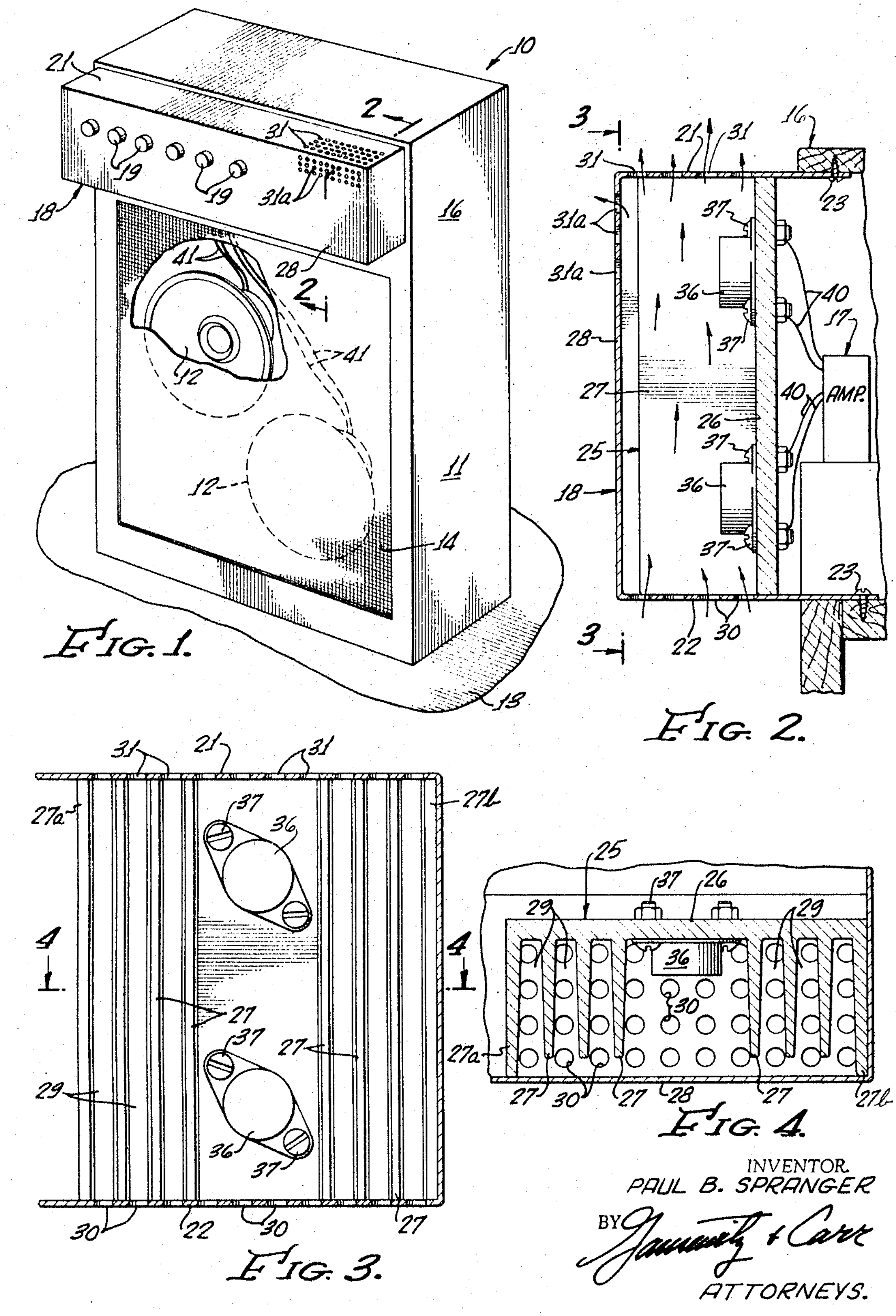
FIGURE 1 is a perspective view illustrating a solid-state amplifier-loudspeaker assembly incorporating the present invention.
FIGURE 2 is an enlarged fragmentary vertical sectional view taken on line 2—2 of FIGURE 1.
FIGURE 3 is a sectional view on line 3—3 of FIGURE 2.
FIGURE 4 is a horizontal sectional view on line 4—4 of FIGURE 3.

Referring particularly to FIGURE 1, the invention is illustrated as incorporated in a solid-state amplifier-loudspeaker combination 10 comprising a speaker-cabinet portion 11 in which are provided one or more loudspeakers 12. The speaker-cabinet portion 11 rests upon a floor 13 or other supporting surface. Speakers 12 are mounted behind a loosely-woven decorative screen or grill cloth 14.

Provided at the upper region of the combination apparatus 10 is an amplifier-cabinet portion 16. The amplifier-cabinet portion 16 contains various solid-state circuitry for producing amplifying effects, reverberation effects, etc. Such circuitry (other than the power transistors) is indicated schematically (in block form) at 17 in FIGURE 2.

The illustrated combination apparatus is generally rectangular, having a wooden frame and wooden walls. Such frame and walls are conventionally covered with a decorative plastic, simulated leather, etc., not shown. Although the illustrated apparatus 10 comprises a single wooden frame and walls forming the speaker-cabinet portion 11 and the amplifier cabinet portion 16, it is to be understood that the amplifier-cabinet portion may, if desired, be removably secured to the upper region of the speaker-cabinet portion.

The amplifier-cabinet portion 16 incorporates a control panel 18 in which are mounted various control knobs 19 which may be adjusted to various settings determining such factors as volume, tone, tremolo, etc. Thus, such knobs are connected to amplifier 17 to control the same. The illustrated control panel 18 is generally rectangular, but it is to be understood that other shapes may be employed. Desirably, the control panel 18 is formed of sheet metal.

Referring particularly to FIGURE 2, the inner edges of the upper and lower walls 21 and 22 of control panel 18 are shown as being secured by screws 23 to wooden wall portions of the cabinet. Thus, by removing the screws 23 it is possible to remove the entire control panel 18 and associated elements bodily from the wooden frame of the apparatus. Access to the screws 23 may be achieved through an opening, not shown, which may be provided in the rear of the apparatus.

Referring to FIGURES 2–4, a heat sink 25 is mounted in or adjacent control panel 18 in any suitable manner, for example by being force-fit therein or by means of screws or mounting bolts, not shown. Heat sink 25 is formed of a metal which is highly heat conductive, and comprises a base or web portion 26 on which are integrally provided a plurality of vertically-oriented fins 27, **27*a* and 27*b*. The various fins are illustrated as being parallel to each other and generally perpendicular to the front wall 28 of the control panel. The end or outer fins, indicated at 27*a* and 27*b*, have edge portions which engage the front wall 28** to thus prevent substantial air leakage.

The fins 27, etc., are spaced from each other to provide flue passages 29 through which air may circulate by convection. Stated more definitely, the air circulates through openings 30 which are provided in the lower wall 22 of the control panel, and through openings 31 which are provided in the upper wall 21 thereof.

Referring particularly to FIGURE 4, the base or web 26, the end (outer) fins **27*a* and 27*b*, and the front wall 28 cooperate to define a chimney which is closed except at the upper and lower regions thereof, such upper and lower regions communicating with the ambient atmosphere. Thus, the lower end of the chimney is registered with the openings 30, whereas the upper end is registered with openings 31. Because the indicated chimney is closed except for the recited openings, and/or others described hereinafter, substantial amounts of heat are not transferred to other portions of the amplifier apparatus. The flue passages 29 formed between the respective fins comprise sub-components of the recited chimney defined by elements 26, 27*a*, 27*b* and 28**.

The power transistors 36 incorporated in the solid-state amplifier are mounted in the designated chimney, being illustrated as secured by bolts 37 to the web or base 26 at a region intermediate spaced ones of the fins 27. The transistors are mounted to such web in heat-transfer relationship, whereby heat generated by the transistors flows through the web to the fins for convective cooling by air flowing through the openings 30 and 31.

It is a very important feature of the invention that the lower wall 22 of the control panel 18 is maintained, as by speaker-cabinet portion 11, in overhanging relationship relative to the speaker-cabinet portion and relative to supporting surface 13. Thus, even in the unlikely event that the control panel 18 is placed against a wall, for example, circulation of air through the openings 30 and 31 is not blocked or impeded.

It is to be understood that the front wall 28 of the control panel 18 is not necessarily vertical, and that the walls 21 and 22 are not necessarily horizontal. It is also to be understood that openings **31*a* may be provided in the upper regions of front wall 28 of the control panel, in place of or in addition to the openings 31 in upper wall 21. However, the openings 31–31*a* should be spaced sufficiently far from openings 30 to prevent recirculation of the warm air which discharges from the chimney. Furthermore, as noted above, it is important that the lower openings 30 be provided in a wall portion which is at least substantially inclined from the vertical and which is in spaced, overhanging relationship relative to the underlying speaker-cabinet portion 11 and/or a supporting surface such as floor 13. The floor or other underlying surface may be much closer to lower wall 22 than in the illustrated embodiment, so long as there is adequate space for flow of air into and through the openings 30**.

In the operation of the described apparatus, the power transistors 36 generate a substantial amount of heat. This heat is conducted to the heat-sink web 26 and thus to the fins 27, **27*a* and 27*b*. Such heating of the heat sink causes the air within the chimney (defined by elements 26, 27*a*, 27*b* and 28) to expand and flow upwardly by convection, passing out through the holes 31 (and/or 31*a***) as indicated by the arrows in FIGURE 2.

The indicated upward flow of air from the chimney through holes 31 and **31*a* effects a constant drawing in of air through the holes 30 at the lower end of the chimney. Consequently, a continuous, convective flow of air passes along the heat sink 25 and results in effective cooling of the power transistors 36**. Because of the abovedescribed overhanging condition of the lower panel wall, the convective circulation of air through the chimney is substantially more pronounced and more efficient than would be the case if such wall were vertical, for example.

Since the heat sink is incorporated in the control panel 18 of the apparatus, and since the lower wall 22 is in the described overhanging relationship, there is no substantial possibility that flow of cooling air through the chimney (and flues 29 incorporated therein) will be blocked. Even if the musician should set an object on the upper holes 31, air may still circulate through the holes **31*a* in the front wall 28 of the panel 18**.

As stated above, the holes 30 are sufficiently far below the holes **31–31*a* that there is little or no chance that warm air emanating from such holes 31–31*a* will circulate downwardly to holes 30. Instead, the air passing through holes 30** will normally be the relatively cool ambient air which is most effective to prevent overheating of the power transistors.

The leads which connect the power transistors 36 to the remaining amplifier portion 17 are schematically indicated at 40 in FIGURE 2. Similarly, the leads from amplifier portion 17 to speakers 12 are shown at 41 in FIGURE 1.

The foregoing detailed description is to be clearly understood as given by way of illustration and example only, the spirit and scope of this invention being limited solely by the appended claims.

I claim:

1. A portable, solid-state amplifier and loudspeaker combination, which comprises:

wooden frame means to form an amplifier-cabinet portion and a speaker-cabinet portion therebeneath,
- said amplifier-cabinet portion containing components of a solid-state amplifier,
- said speaker-cabinet portion containing at least one loudspeaker electrically connected to said components of said amplifier, a sheet-metal control panel mounted at the front of said amplifier-cabinet portion,
- said control panel having mounted thereon adjustable control elements for said components of said amplifier,
- said control panel cooperating with said wooden frame means to define a chamber in which are disposed said components of said amplifier, a heat sink mounted in said chamber adjacent said control panel, a power transistor mounted on said heat sink in heat-transfer relationship relative thereto,
- said transistor forming part of said amplifier, and upper and lower port means provided in upper and lower regions of said control panel adjacent said heat sink,
- said port means being disposed to effect convective inflow of air from the ambient atmosphere through said lower port means into heat-transfer contact with said heat sink, and convective outflow of said air from said heat sink through said upper port means and back to the ambient atmosphere.

2. The invention as claimed in claim 1, in which means are provided to define a chimney through which said air flows in passing from said lower port means to said upper port means.

3. The invention as claimed in claim 2 in which said control panel has a lower portion disposed in spaced, overhanging relationship relative to said speaker-cabinet portion, and in which said lower port means are provided in said overhanging lower portion.

4. The invention as claimed in claim 2, in which said heat sink comprises a metal web having a substantial number of fins extending therefrom in generally parallel relationship, said fins defining flue passages which form parts of said chimney.

5. The invention as claimed in claim 4, in which said means to define said chimney include said web and said control panel, and in which means are provided to prevent substantial flow of air into or out of said chimney except through said port means.

References Cited

UNITED STATES PATENTS

| | | | |
|---|---|---|---|
| 2,471,011 | 5/1949 | Shapiro | 317—100 |
| 2,760,122 | 8/1956 | Harris | 317—100 X |
| 2,965,819 | 12/1960 | Rosenbaum | 165—128 X |
| 3,126,450 | 3/1964 | Neil et al. | |
| 3,236,296 | 2/1966 | Dubin | 317—100 X |
| 3,317,796 | 5/1967 | Thompson | 317—100 |
| 3,247,896 | 4/1966 | Chu et al. | 317—100 X |
| 3,299,946 | 1/1967 | Recklinghausen | 317—100 X |
| 3,369,597 | 2/1968 | Dronsuth et al. | 165—80 |

OTHER REFERENCES

Butt, Paul: German printed application No. 1,178,479, published Sept. 24, 1964.

KATHLEEN H. CLAFFY, Primary Examiner

VAN C. WILKS, Assistant Examiner

U.S. Cl. X.R.

165—80, 128; 317—100